(12) United States Patent
Liu et al.

(10) Patent No.: US 9,754,908 B2
(45) Date of Patent: Sep. 5, 2017

(54) WAFER WITH LIQUID MOLDING COMPOUND AND POST-PASSIVATION INTERCONNECT

(71) Applicant: Taiwan Semiconductor Manufacturing Company, Ltd., Hsin-Chu (TW)

(72) Inventors: Chung-Shi Liu, Hsin-Chu (TW); Chia-Wei Tu, Hsin-Chu (TW); Ming-Da Cheng, Hsin-Chu (TW); Wen-Hsiung Lu, Hsin-Chu (TW); Yu-Peng Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/932,530

(22) Filed: Nov. 4, 2015

(65) Prior Publication Data

US 2016/0056117 A1    Feb. 25, 2016

Related U.S. Application Data

(62) Division of application No. 13/789,955, filed on Mar. 8, 2013, now Pat. No. 9,196,559.

(51) Int. Cl.
*H01L 23/00* (2006.01)
*H01L 23/31* (2006.01)
(Continued)

(52) U.S. Cl.
CPC ............ *H01L 24/13* (2013.01); *H01L 21/566* (2013.01); *H01L 21/78* (2013.01); *H01L 23/295* (2013.01);
(Continued)

(58) Field of Classification Search
None
See application file for complete search history.

(56) References Cited

U.S. PATENT DOCUMENTS

| 2004/0000728 A1 | 1/2004 | Kurafuchi et al. |
| 2004/0102601 A1* | 5/2004 | Saito ............... C08F 283/00 |
| | | 528/271 |

(Continued)

FOREIGN PATENT DOCUMENTS

| JP | 2003218151 | 7/2003 |
| JP | 2003282614 | 10/2003 |
| KR | 1020130020512 | 2/2013 |

OTHER PUBLICATIONS

Rector, L. "Transfer Molding Encapsulation of Flip Chip Array Packages" Int. Journ. of Micro. and Elec. Pack. vol. 23, No. 4 Dec. 2000 pp. 400-406.*

(Continued)

*Primary Examiner* — Matthew Landau
*Assistant Examiner* — Grant Withers
(74) *Attorney, Agent, or Firm* — Slater Matsil, LLP

(57) ABSTRACT

A method includes forming a passivation layer over a metal pad, wherein the metal pad is further overlying a semiconductor substrate of a wafer. A Post-Passivation Interconnect (PPI) is formed to electrically couple to the metal pad, wherein a portion of the PPI is overlying the passivation layer. A metal bump is formed over and electrically coupled to the PPI. The method further includes applying a molding compound over the metal bump and the PPI, applying a release film over the molding compound, pressing the release film against the molding compound, and curing the molding compound when the release film is pressed against the molding compound. The release film is then removed from the molding compound. The wafer is sawed into dies (Continued)

using a blade, with the blade cutting through the molding compound.

19 Claims, 7 Drawing Sheets

(51) Int. Cl.
| | |
|---|---|
| H01L 21/78 | (2006.01) |
| H01L 23/29 | (2006.01) |
| H01L 21/56 | (2006.01) |
| H01L 23/532 | (2006.01) |
| H01L 23/522 | (2006.01) |
| H01L 23/528 | (2006.01) |
| H01L 23/525 | (2006.01) |

(52) U.S. Cl.
CPC ...... *H01L 23/3171* (2013.01); *H01L 23/3192* (2013.01); *H01L 23/528* (2013.01); *H01L 23/5226* (2013.01); *H01L 23/5329* (2013.01); *H01L 23/53228* (2013.01); *H01L 23/53238* (2013.01); *H01L 23/525* (2013.01); *H01L 24/03* (2013.01); *H01L 24/05* (2013.01); *H01L 24/11* (2013.01); *H01L 2224/0345* (2013.01); *H01L 2224/0346* (2013.01); *H01L 2224/0347* (2013.01); *H01L 2224/0401* (2013.01); *H01L 2224/05022* (2013.01); *H01L 2224/05124* (2013.01); *H01L 2224/05139* (2013.01); *H01L 2224/05144* (2013.01); *H01L 2224/05147* (2013.01); *H01L 2224/05166* (2013.01); *H01L 2224/05181* (2013.01); *H01L 2224/05186* (2013.01); *H01L 2224/05548* (2013.01); *H01L 2224/05582* (2013.01); *H01L 2224/05647* (2013.01); *H01L 2224/1191* (2013.01); *H01L 2224/11849* (2013.01); *H01L 2224/13014* (2013.01); *H01L 2224/13022* (2013.01); *H01L 2224/13023* (2013.01); *H01L 2224/13024* (2013.01); *H01L 2224/13027* (2013.01); *H01L 2224/13111* (2013.01); *H01L 2224/13147* (2013.01); *H01L 2224/13193* (2013.01); *H01L 2224/94* (2013.01); *H01L 2924/12042* (2013.01); *H01L 2924/35121* (2013.01)

(56) References Cited

U.S. PATENT DOCUMENTS

| | | | |
|---|---|---|---|
| 2004/0175914 A1 | 9/2004 | Shizuno et al. | |
| 2005/0186762 A1 | 8/2005 | Senoo et al. | |
| 2006/0228562 A1* | 10/2006 | Ukawa | C08G 59/027 428/413 |
| 2008/0090176 A1* | 4/2008 | Kusunoki | C08G 59/3218 430/280.1 |
| 2008/0131646 A1* | 6/2008 | Tanaka | B32B 27/08 428/76 |
| 2008/0132037 A1* | 6/2008 | Furui | B81C 1/00888 438/465 |
| 2008/0258317 A1 | 10/2008 | Ejima | |
| 2009/0046183 A1 | 2/2009 | Nishida et al. | |
| 2010/0178501 A1* | 7/2010 | Masuko | C09J 4/06 428/355 N |
| 2010/0294781 A1* | 11/2010 | Kaneko | C08L 9/06 220/660 |
| 2011/0017400 A1* | 1/2011 | Dershem | C07F 7/0852 156/331.1 |
| 2012/0248632 A1* | 10/2012 | Mitsukura | C09J 7/0203 257/787 |
| 2012/0319268 A1* | 12/2012 | Kagimoto | B32B 15/08 257/734 |
| 2013/0009307 A1 | 1/2013 | Lu et al. | |
| 2013/0043583 A1 | 2/2013 | Wu et al. | |
| 2013/0049781 A1 | 2/2013 | Ko et al. | |
| 2014/0171575 A1* | 6/2014 | Mercx | C08K 3/22 524/433 |
| 2014/0187017 A1* | 7/2014 | Bae | C08G 77/00 438/381 |
| 2014/0252593 A1* | 9/2014 | Chen | H01L 23/49811 257/737 |
| 2014/0322647 A1* | 10/2014 | Knapp | G03F 7/0045 430/270.1 |
| 2014/0326313 A1* | 11/2014 | Hong | C08J 5/18 136/259 |

OTHER PUBLICATIONS

Joshi, M "Molded Underfill Technology for Flip Chip Packages in Mobile Applications" Proc. of the 60th Elec. Comp. and Tech. Conf. (ECTC), dated Jun. 4, 2010 pp. 1250-1257.*

Forrest, J.A. et al., "Effect of Free Surfaces on the Glass Transition Temperature of Thing Polymer Films," Physical Review Letters, vol. 77, No. 10, Sep. 1996, pp. 2002-2005.

Josh, M. et al., "Molded Underfill (MUF) Technology for Flip Chip Packages in Mobile Applications," Electronic Components and Technology Conference, 2010, pp. 1250-1257.

Ko, Minjin et al., "The Effect of Filler on the Properties of Molding Compounds and Their Moldability," Electronic Components and Technology Conference, IEEE, 1997, pp. 108-113.

Rector, Louis P., et al. "Transfer Modling Encapsulation of Flip Chip Array Packages,"The International Journal of Microcircuits and Electronic Packaging, vol. 23, No. 4, Fourth Quarter, ISSN 1063-1674, 2000, pp. 400-406.

Tada, Kazuhiro et al., "Properties of Molding Compounds to Improve Package Reliability of SMD's," IEEE Transactions on Components and Packaging Technology, vol. 22, No. 4, Dec. 1999, pp. 534-540.

* cited by examiner

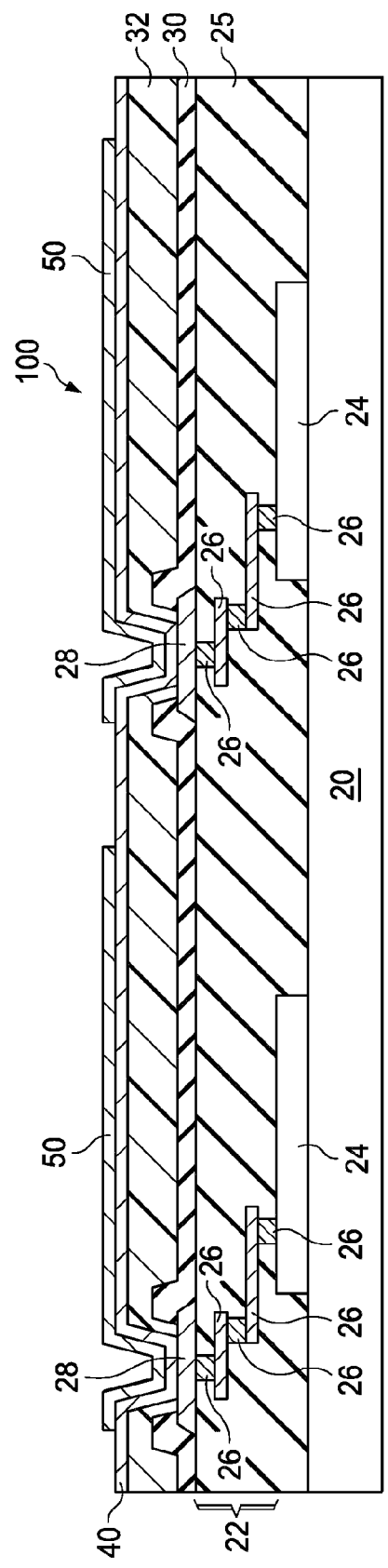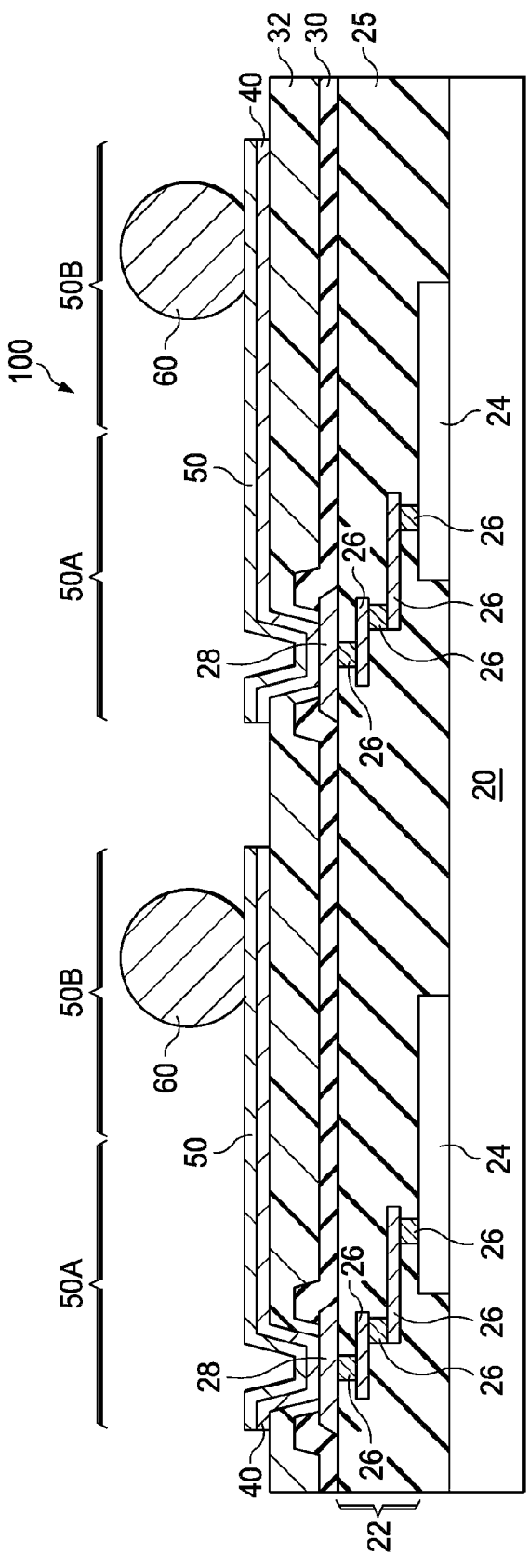
FIG. 5
FIG. 6

WAFER WITH LIQUID MOLDING COMPOUND AND POST-PASSIVATION INTERCONNECT

PRIORITY CLAIM AND CROSS-REFERENCE

This application is a divisional of U.S. patent application Ser. No. 13/789,955, entitled "Directly Sawing Wafers Covered with Liquid Molding Compound," filed on Mar. 8, 2013, which application is incorporated herein by reference.

BACKGROUND

In the integrated circuit manufacturing process, integrated circuit devices, such as transistors, are first formed at the surface of a semiconductor substrate in a wafer. An interconnect structure is then formed over the integrated circuit devices. Metal pads are formed over, and are electrically coupled to, the interconnect structure. A passivation layer and a first polymer layer are formed on the metal pads, with the metal pads exposed through the openings in the passivation layer and the first polymer layer. A Post-Passivation Interconnect (PPI) structure is then formed, which includes redistribution lines connected to the metal pads. A second polymer layer is then formed over the PPI. Under-Bump-Metallurgies (UBMs) are formed to extend into the openings in the second polymer layer, wherein the UBMs are electrically connected to the PPI. Solder balls are then placed over the UBMs and reflowed.

The wafer is then sawed. Since the wafer includes a plurality of layers formed of different materials, if the wafer is sawed directly, the plurality of layers may delaminate. To prevent the delamination between the plurality of layers in the wafer, a laser grooving is first performed on the scribe lines in order to remove the layers that are subject to delamination. In order to perform the laser grooving, a protection layer is formed on the wafer. The Laser grooving is then performed. During the laser grooving, the debris generated by the laser grooving may fall on the protection layer. After the laser grooving, the protection layer is removed along with the debris thereon. The formation and the removal of the protection layer result in additional manufacturing cost.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 10 are cross-sectional views of intermediate stages in the manufacturing of a wafer and the respective dies in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A wafer and the respective dies, and the method of forming the same are provided in accordance with various exemplary embodiments. The intermediate stages of forming the wafer and dies are illustrated. The variations of the wafer and dies in accordance with embodiments are discussed. Throughout the various views and illustrative embodiments, like reference numbers are used to designate like elements.

Figure 1:
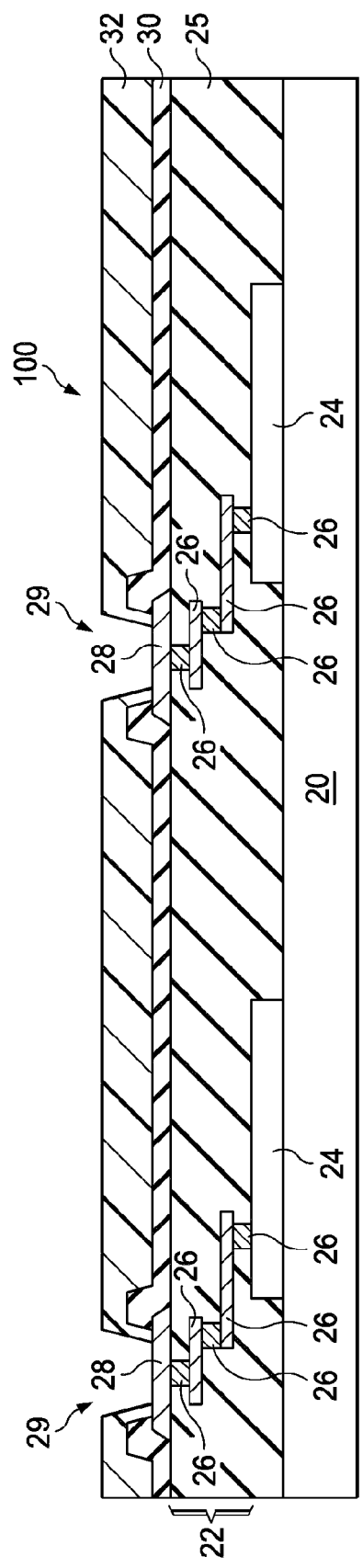

Referring to FIG. 1, wafer 100 is provided. Wafer 100 includes substrate 20, which may be a semiconductor substrate, such as a silicon substrate, although it may be formed of other semiconductor materials including, and not limited to, silicon germanium, silicon carbon, gallium arsenide, or the like. In some embodiments, wafer 100 is a device wafer, and semiconductor devices 24, such as transistors, are formed at the surface of substrate 20. Interconnect structure 22, which includes metal lines and vias 26 formed therein, is formed over substrate 20. Metal lines and vias 26 are electrically coupled to semiconductor devices 24. The metal lines and vias may be formed of copper or copper alloys, and may be formed using damascene processes. Interconnect structure 22 may include a plurality of dielectric layers 25, which may include an Inter-Layer Dielectric (ILD, not shown) and Inter-Metal Dielectrics (IMDs, not shown), with metal lines and vias 26 disposed in dielectric layers 25. In alternative embodiments, wafer 100 is an interposer wafer or a package substrate, and is substantially free from integrated circuit devices therein, which integrated circuit devices include transistors, resistors, capacitors, inductors, and/or the like.

Metal pads 28 are formed over interconnect structure 22. Metal pads 28 may comprise aluminum (Al), copper (Cu), silver (Ag), gold (Au), nickel (Ni), tungsten (W), alloys thereof, and/or multi-layers thereof. Metal pads 28 may be electrically coupled to semiconductor devices 24, for example, through metal lines and vias 26. Passivation layer 30 may be formed to cover edge portions of metal pad 28. In some exemplary embodiments, passivation layer 30 comprises a silicon oxide layer and a silicon nitride layer over the silicon oxide layer, although other dielectric materials such as Un-doped Silicate Glass (USG) may be used. Openings 29 are formed in passivation layer 30, and hence the central portions of metal pads 28 are exposed through openings 29.

Polymer layer 32 is formed over passivation layer 30, wherein polymer layer 32 extends into openings 29 in passivation layer 30. Polymer layer 32 may include a photo sensitive material in accordance with some embodiments. For example, the material of polymer layer 32 includes, and is not limited to, polyimide, polybenzoxazole (PBO), and the like. Polymer layer 32 is also patterned to form additional openings, so that metal pads 28 are exposed.

Figure 2:
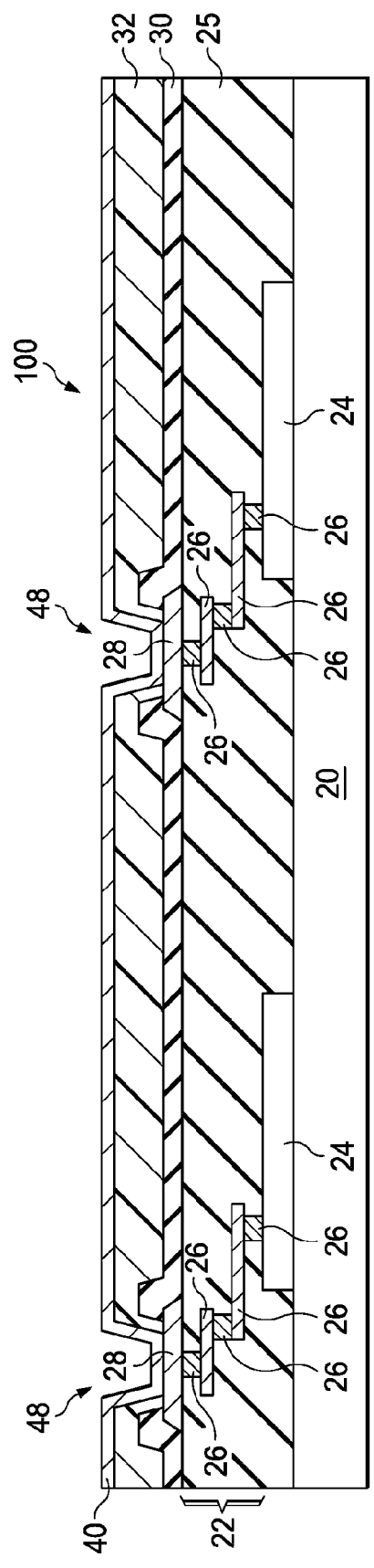

Next, as shown in FIG. 2, seed layer 40 is formed over polymer layer 32. In some embodiments, seed layer 40 is a composite layer comprising a plurality of layers. For example, seed layer 40 may include a bottom layer and an upper layer (not shown), wherein the bottom layer includes a titanium layer, a titanium nitride layer, a tantalum layer, a tantalum nitride layer, or the like. The materials of the upper layer may include copper or copper alloys. In alternative embodiments, seed layer 40 may be a single layer, which may be a copper layer, for example. Seed layer 40 may be formed using Physical Vapor Deposition (PVD), while other applicable methods may also be used.

Figure 3:
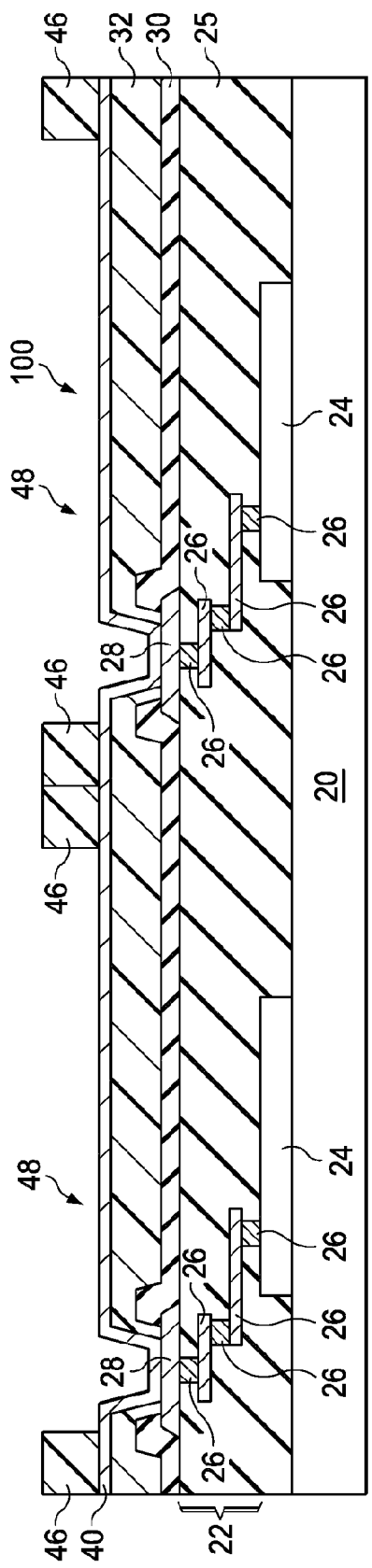
Figure 4:
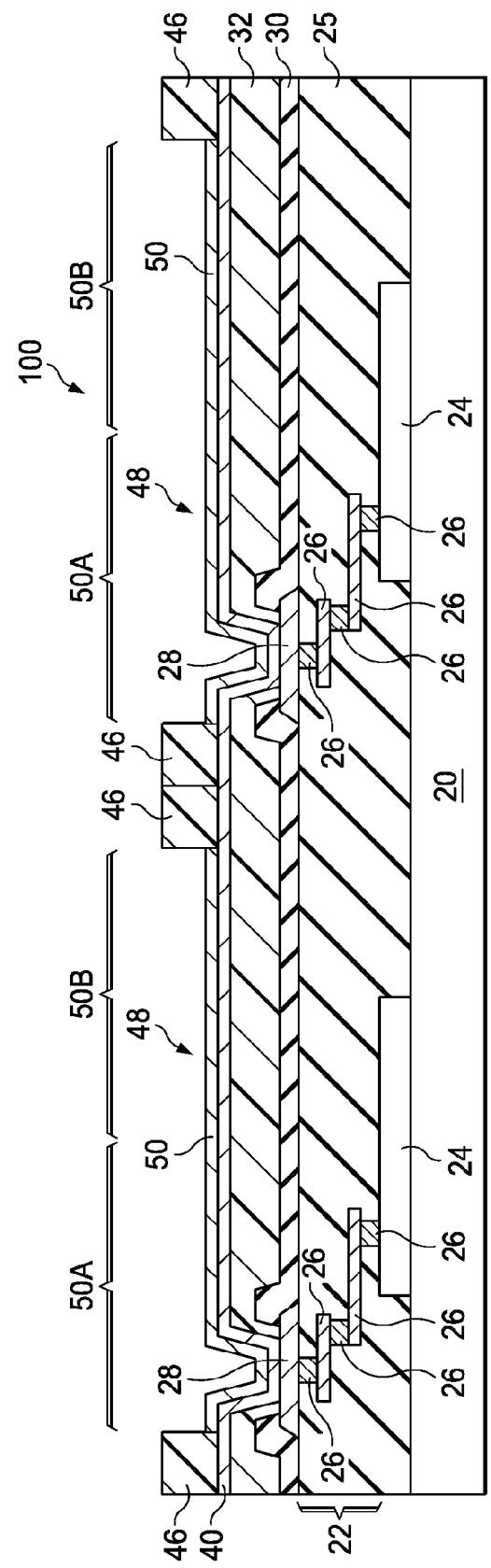

FIG. 3 illustrates the formation of mask 46. In some embodiments, mask 46 is formed of a photo resist, and hence is alternatively referred to as photo resist 46 throughout the description, although other materials may be used. Mask 46 is patterned to form openings 48, through which some portions of seed layer 40 are exposed. Next, a plating step is performed to form Post-Passivation Interconnects (PPIs) 50 in opening 48, as shown in FIG. 4. PPIs 50 may comprise a copper-containing layer including copper or copper alloys. PPIs 50 may include PPI lines 50A and PPI pads 50B, wherein PPI pads 50B are wider than the respective connecting PPI lines 50A. In alternative embodiments, PPIs 50 comprise a nickel-containing layer, a palladium-containing layer, and/or the like, in additional to the copper-containing layer.

In FIG. 5, photo resist 46 is removed in a photo resist stripping process. Next, as shown in FIG. 6, the exposed portions of seed layer 40 that were previously covered by photo resist 46 are removed through etching, while the portions of seed layer 40 covered by PPIs 50 remain un-removed.

FIG. 6 also illustrates the placement of electrical connectors 60 on PPI pads 50B, wherein electrical connectors 60 may be solder balls (and hence are referred to solder bumps 60 hereinafter). Solder bumps 60 may be formed of a Sn—Ag alloy, a Sn—Ag—Cu alloy, or the like, and may be lead-free or lead-containing. After the placement, solder bumps 60 are reflowed. The top surfaces of solder bumps 60 thus have spherical shapes.

Figure 7:
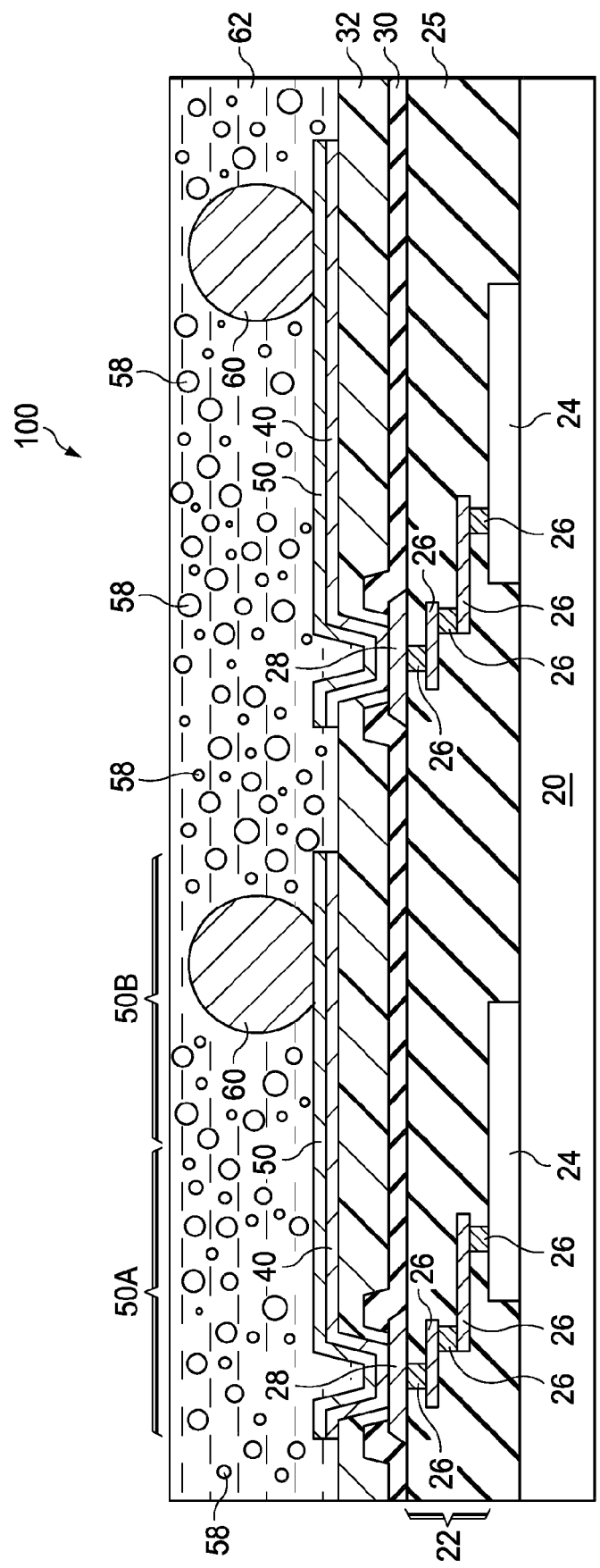

Next, as shown in FIG. 7, liquid molding compound 62 is applied on wafer 100, wherein solder bumps 60 are submerged in liquid molding compound 62. Liquid molding compound 62 is applied in the form of a liquid. In some embodiments, liquid molding compound 62 has a glass transition temperature (Tg) higher than about 150° C. and a flexural modulus (measured at 25° C.) lower than about 10 GPa, or between about 2 GPa and 10 GPa. The glass transition temperature Tg of liquid molding compound 62 may also be between about 150° C. and 200° C. Exemplar materials of liquid molding compound 62 include, and are not limited to, Cyclotrisiloxane-hexamethyl ($C_6H_{18}O_3Si_3$), Cyclohexene ($C_6H_{10}$), 2-Norbornene ($C_7H_{10}$), and 5-Ethyl-bicyclo[2.2.1]-2-heptene ($C_9H_{14}$).

Liquid molding compound 62 may comprise filler 58 therein, which is pre-mixed into liquid molding compound 62 before it is applied on wafer 100. In some embodiments, filler 58 comprises the particles of $Al_2O_3$, $SiO_2$, $TiO_2$, and/or the like. The diameters (sizes) of filler 58 may be smaller than about 10 μm, and may be smaller than about 5 μm. Furthermore, the sizes of filler 58 may be smaller than the widths (viewed in the top view) of PPI lines 50A, and may also be smaller than about a half the widths of PPI lines 50A. Since liquid molding compound 62 will be pressed in a subsequent process step, making the sizes of filler 58 smaller than a half of the widths of PPI lines 50A help improve the uniformity in the distribution of filler 58 in liquid molding compound 62. The uniform distribution of filler 58 may result in a uniform distribution of stresses in liquid molding compound 62, and a uniform distribution of stresses on solder bumps 60 after solder bumps 60 are used for bonding.

Figure 8:
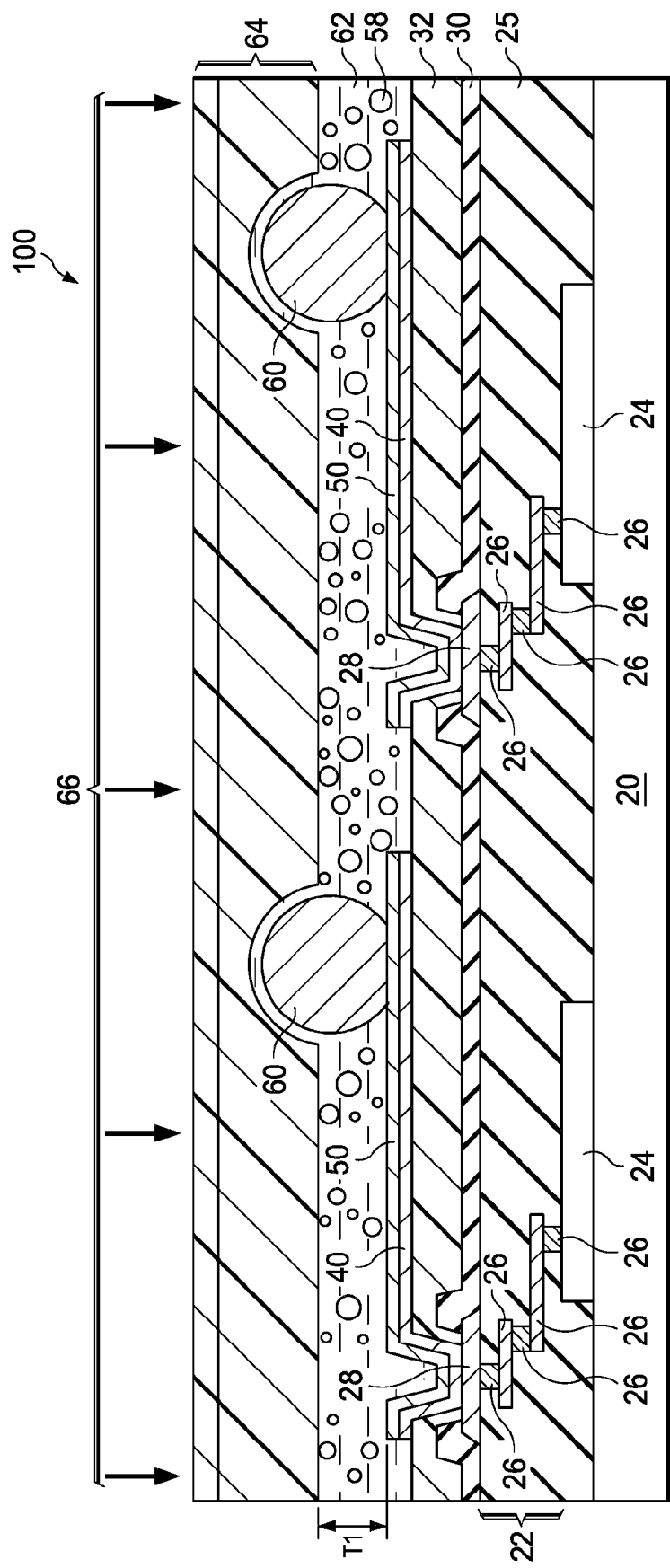

Referring to FIG. 8, release film 64 is applied on liquid molding compound 62. A pressure, as shown as arrows 66, is applied on release film 64. Release film 64 is formed of a soft material, so that the top portions of solder bumps 60 are pressed into release film 64. Furthermore, release film 64 pushes some of liquid molding compound 62 away from the top surface of wafer 100, and the bottom surface of release film 64 is lower than the top ends of solder bumps 60. With release film 64 remaining being pushed against solder bump 60 and liquid molding compound 62, a curing step is performed to cure and solidify liquid molding compound 62. Liquid molding compound 62, after being solidified, is referred to as molding compound 62 hereinafter, although they may also be referred to as a "liquid molding compound" even if it is no longer in liquid form. In some embodiments, the curing is performed at a temperature between about 140° C. and about 160° C., for example, for a period of time between about 3 minutes and about 10 minutes. The curing temperature may be adjusted depending on the material of molding compound 62. After the solidification of molding compound 62, the top ends of solder bumps 60 protrude out of the top surface of the major portions of molding compound 62. In some embodiments, molding compound 62 has thickness T1 greater than about 50 μm. Thickness T1 may also be between about 50 μm and about 200 μm. A greater thickness T1 may help protect wafer 100 from delamination in a subsequent die saw step.

Figure 9:
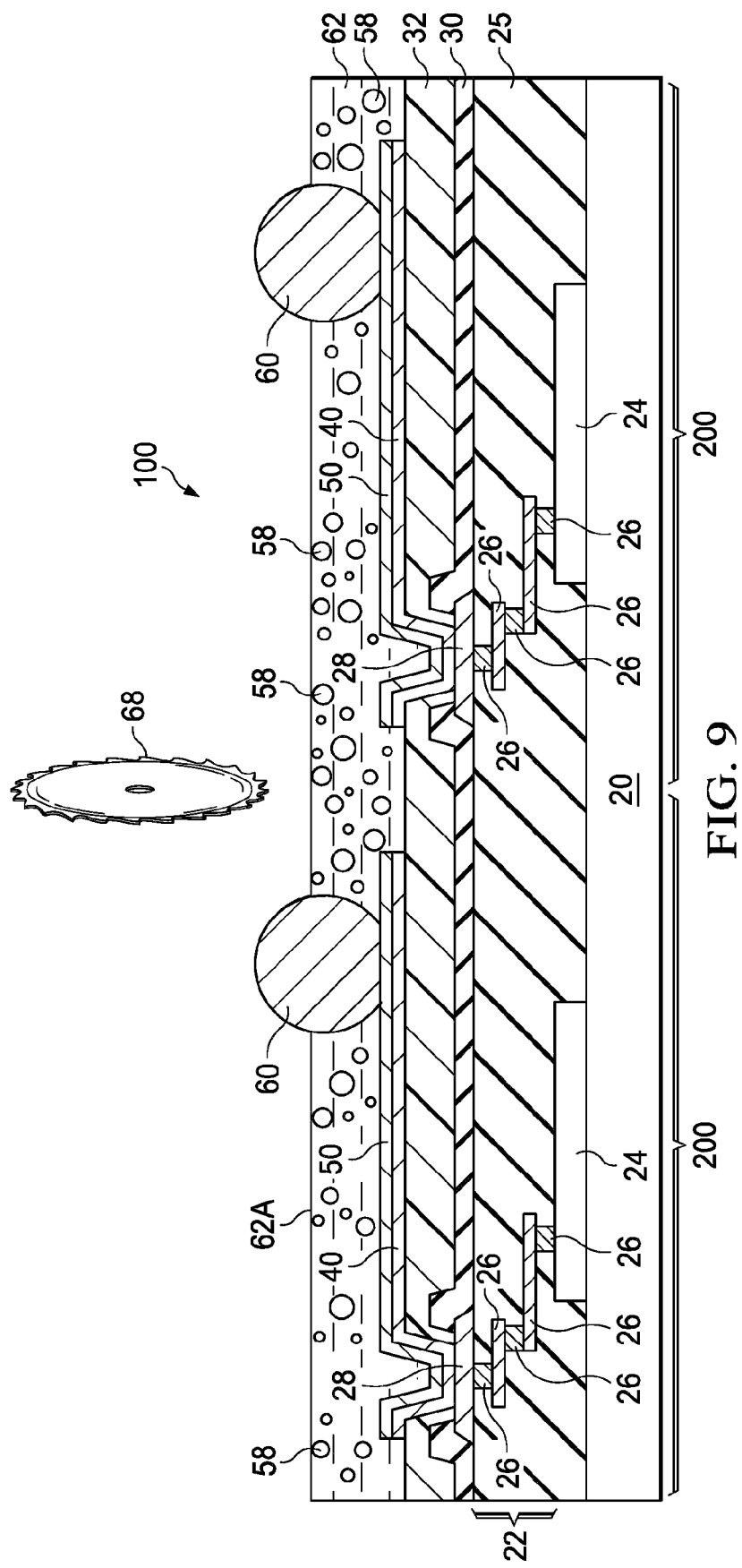

Release film 64 is then peeled off from molding compound 62, which is now in a solid form. The resulting structure is shown in FIG. 9. The residue of molding compound 62 remaining on the top surfaces of solder bumps 60 is then removed. In some embodiments, the residue of molding compound 62 is removed through a plasma cleaning step, in which the plasma of process gases such as argon is used to bombard the residue of molding compound 62. In alternative embodiments, the residue of molding compound 62 is removed through etching. In the resulting structure, the bottom portions of solder bumps 60 are buried in molding compound 62. The top ends of solder bumps 60 may be higher than top surface 62A of molding compound 62. The top portions of solder bumps 60 above molding compound 62 may remain to have spherical surfaces, or rounded surfaces close to spherical surfaces.

FIG. 9 also illustrates the die saw step performed on wafer 100, and hence a plurality of dies 200 is sawed from wafer 100. In accordance with some embodiments, the die saw is performed without performing laser grooving on wafer 100. The die saw is performed using blade 68, which is used to saw through molding compound 62, polymer layer 32, passivation layer 30, and underlying interconnect structure 22 and substrate 20.

Figure 10:
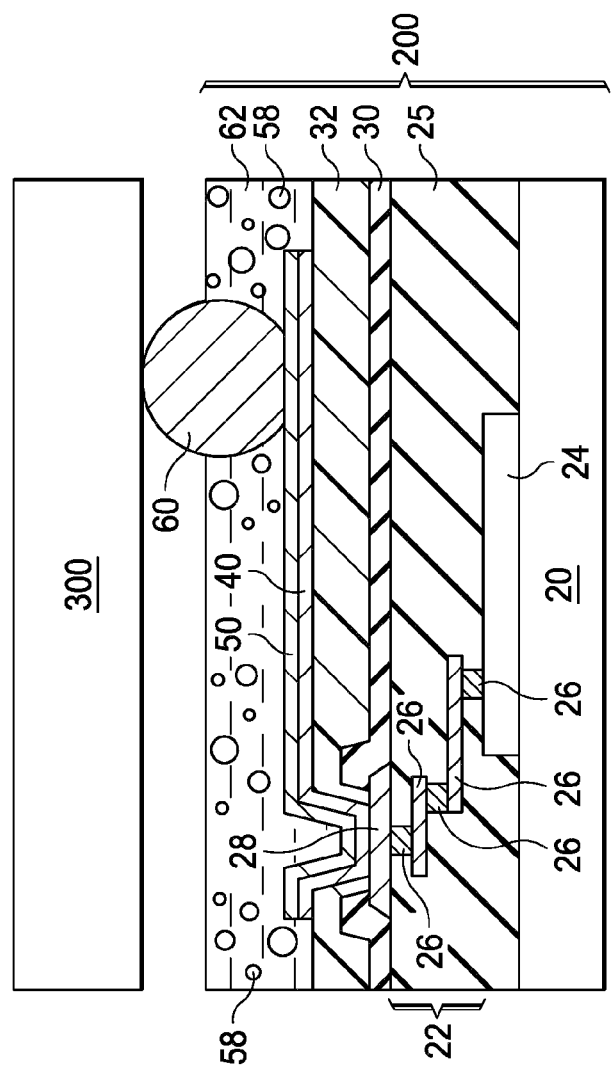

In the resulting die 200, as shown in FIG. 10, the edges of molding compound 62, polymer layer 32, passivation layer 30, and the underlying interconnect structure 22 and substrate 20 are aligned. FIG. 10 also illustrates the bonding of die 200 to another package component 300, which may be a package substrate, an interposer, a printed circuit board, for example.

In the embodiments of the present disclosure, with the formation of (liquid) molding compound 62, a direct die saw may be performed on wafer 100 without the need of performing laser grooving on wafer 100 first. Due to the protection of (liquid) molding compound 62, wafer 100 does not suffer from delamination between layers (such as layers 25, 30, and 32) during the die saw process. Furthermore, by selecting the glass transition temperature Tg of (liquid) molding compound 62 to be higher than about 150° C., or between about 150° C. and about 200° C., and/or (liquid) molding compound 62 with flexural modulus lower than about 10 GPa (for example, between about 2 GPa and about 10 GPa), solder bumps 60 are also protected from cracking in thermal cycles performed after die 200 is bonded to package component 300. When experiencing thermal cycles, the delamination between the layers in die 200 (such as layers 25, 30, and 32) is also eliminated when appropriate glass transition temperature Tg is used. A plurality of groups of sample wafers and sample dies were made to study the relationship between the glass transition temperature Tg of liquid molding compound 62 and the reliability of dies 200. The sample dies were bonded to package substrates, and were performed with thermal cycles after the bonding. The first group of sample dies includes (liquid) molding compounds 62 having glass transition temperatures Tg equal to about 60° C. The second group of sample dies includes (liquid) molding compounds 62 having glass transition temperatures Tg equal to about 135° C. The third group of sample dies includes (liquid) molding compounds 62 having glass transition temperatures Tg equal to about 160° C. The fourth group of sample dies includes (liquid) molding compounds 62 having glass transition temperatures Tg equal to about 175° C. The experiment results revealed that after thermal cycles, 49 out of 49 of the first group of sample dies failed, 7 out of 49 of the second group of sample dies failed, and none of the third and the fourth groups of sample dies failed. This proves that the ranges of the glass transition temperatures Tg of (liquid) molding compounds 62 significantly affects the reliability of the bonded dies 200. When the glass transition temperature of (liquid) molding compounds 62 is further increased to higher than about 200° C., however, the Young's modulus of molding compounds 62 may become too high, and hence molding compounds 62 start to lose their ability for absorbing stresses.

In accordance with some embodiments, a method includes forming a passivation layer over a metal pad, wherein the metal pad is further overlying a semiconductor substrate of a wafer. A PPI is formed to electrically couple to the metal pad, wherein a portion of the PPI is overlying the passivation layer. A metal bump is formed over and electrically coupled to the PPI. The method further includes applying a liquid molding compound over the metal bump and the PPI, applying a release film over the liquid molding compound, pressing the release film against the liquid molding compound, and curing the liquid molding compound when the release film is pressed against the liquid molding compound. The release film is then removed from the liquid molding compound. The wafer is sawed into dies using a blade, with the blade cutting through the liquid molding compound.

In accordance with other embodiments, a method includes forming a passivation layer over a metal pad, wherein the metal pad is further overlying a semiconductor substrate of a wafer. A first opening is formed in the passivation layer, wherein a portion of the metal pad is exposed through the first opening. A seed layer is formed over the passivation layer, wherein the seed layer is electrically coupled to the metal pad. A PPI is formed over the seed layer. The method further includes placing a solder ball over the PPI, reflowing the solder ball, applying a liquid molding compound over the solder ball and the PPI, and pressing a release film against the liquid molding compound. The liquid molding compound is then cured, and the release film is removed. A die saw step is performed on the wafer to saw the wafer into a plurality of dies, wherein no laser grooving is performed on the wafer.

In accordance with yet other embodiments, a die includes a substrate, a metal pad over the substrate, a passivation layer including a portion over the metal pad, and a polymer layer over the passivation layer. A PPI has a first portion over the polymer layer, and a second portion extending into the polymer layer, wherein the PPI is electrically coupled to the metal pad. A solder bump is over and electrically coupled to a portion of the PPI. A molding compound is over the PPI, wherein the molding compound surrounds, and is in physical contact with, a lower portion of the solder bump. An upper portion of the solder bump protrudes out of the molding compound. Edges of the molding compound are aligned to respective edges of the die.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A die comprising:
   a substrate;
   a metal pad over the substrate;
   a passivation layer comprising a portion over the metal pad;
   a polymer layer over the passivation layer;
   a Post-Passivation Interconnect (PPI) comprising a first portion over the polymer layer, and a second portion extending into the polymer layer, wherein the PPI is electrically coupled to the metal pad;
   a metal bump over and electrically coupled to a portion of the PPI; and
   a molding compound over the PPI, wherein the molding compound surrounds, and is in physical contact with, a lower portion of the metal bump, wherein an upper portion of the metal bump protrudes out of the molding compound, and wherein edges of the molding compound extend to respective edges of the die, and wherein the molding compound comprises a filler therein, wherein particles in the filler have sizes smaller than widths of the PPI, and the sizes and the widths are viewed in a top view of the die, wherein the molding compound has a glass transition temperature between about 150° C. and about 200° C. and the glass transition temperature is an inherent property of the molding compound, and the molding compound further has a flexural modulus between about 2 GPa and about 10 GPa, with the flexural modulus being measured at 25° C.

2. The die of claim 1, wherein the molding compound is in physical contact with a PPI pad of the PPI.

3. The die of claim 1, wherein the molding compound comprises a filler, and wherein the molding compound further comprises a material selected from the group consisting essentially of Cyclotrisiloxane-hexamethyl ($C_6H_{18}O_3Si_3$), Cyclohexene ($C_6H_{10}$), 2-Norbornene ($C_7H_{10}$), and 5-Ethylbicyclo[2.2.1]-2-heptene ($C_9H_{14}$).

4. The die of claim 1, wherein the metal bump has a spherical top surface, and wherein the metal bump comprises a material selected from the group consisting essentially of solder, copper, and combinations thereof.

5. The die of claim 1, wherein the metal bump comprises a solder region, and the solder region is in physical contact with a copper-containing material of the PPI.

6. The die of claim 1, wherein the PPI comprises copper.

7. The die of claim 1, wherein the PPI comprises a nickel-containing layer, and the metal bump is in contact with the nickel-containing layer.

8. A die comprising:
a substrate;
a metal pad over the substrate;
a passivation layer comprising a portion covering edge portions of the metal pad;
a polymer layer over the passivation layer;
a Post-Passivation Interconnect (PPI) comprising a copper-containing material as a top surface portion, wherein the copper-containing material comprises:
a first portion over the polymer layer; and
a second portion extending into the polymer layer to electrically couple to the metal pad;
a solder region over and in physical contact with the copper-containing material of the PPI; and
an encapsulating material in physical contact with both the solder region and the PPI, wherein the encapsulating material comprises a filler therein, and particles in the filler have sizes smaller than widths of the PPI, with the widths being viewed from a top view of the PPI, wherein the encapsulating material has a glass transition temperature higher than about 150° C., and the glass transition temperature is an inherent property of the encapsulating material, and wherein the encapsulating material has a flexural modulus between about 2 GPa and about 10 GPa, with the flexural modulus being measured at 25° C.

9. The die of claim 8, wherein the particles in the filler have sizes smaller than a half of the widths of the PPI.

10. The die of claim 8, wherein the encapsulating material is in physical contact with a sidewall of the copper-containing material of the PPI.

11. The die of claim 8, wherein the solder region has a spherical top surface protruding above a top surface of the encapsulating material.

12. The die of claim 8, wherein the glass transition temperature of the encapsulating material is between about 150° C. and about 200° C.

13. A die comprising:
a polymer layer;
a Post-Passivation Interconnect (PPI) comprising a first portion over the polymer layer, and a second portion extending into the polymer layer, wherein the PPI comprises a copper-containing material;
a solder region over and in physical contact with the copper-containing material of the PPI; and
an encapsulating material in physical contact with the solder region, the copper-containing material, and the polymer layer, wherein an upper portion of the solder region protrudes out of the encapsulating material, and the encapsulating material has a flexural modulus between about 2 GPa and about 10 GPa, with the flexural modulus being measured at 25° C., and wherein the encapsulating material has a glass transition temperature higher than about 150° C., and the glass transition temperature is an inherent property of the encapsulating material.

14. The die of claim 13, wherein the encapsulating material comprises a filler therein, and particles in the filler have sizes smaller than a half of widths of the PPI.

15. The die of claim 13, wherein the solder region has a spherical top surface protruding out of the encapsulating material.

16. The die of claim 13, wherein the encapsulating material is in physical contact with a sidewall of the copper-containing material of the PPI.

17. The die of claim 13, wherein edges of the encapsulating material is co-terminus with edges of the polymer layer.

18. The die of claim 13, wherein the solder region is in physical contact with a copper-containing material of the PPI.

19. The die of claim 13, wherein the glass transition temperature of the encapsulating material is between about 150° C. and about 200° C.

* * * * *